(12) United States Patent
Feger et al.

(10) Patent No.: US 8,820,612 B2
(45) Date of Patent: *Sep. 2, 2014

(54) INJECTION MOLDED SOLDER PROCESS FOR FORMING SOLDER BUMPS ON SUBSTRATES

(75) Inventors: Claudius Feger, Poughkeepsie, NY (US); Mark H. McLeod, Poughkeepsie, NY (US); Jae-Woong Nah, New York, NY (US); Eric D. Perfecto, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/525,855

(22) Filed: Jun. 18, 2012

(65) Prior Publication Data
US 2012/0305631 A1 Dec. 6, 2012

Related U.S. Application Data

(63) Continuation of application No. 13/154,412, filed on Jun. 6, 2011.

(51) Int. Cl.
*B23K 3/00* (2006.01)
*B23K 3/06* (2006.01)

(52) U.S. Cl.
USPC ............... 228/122.1; 228/123.1; 228/124.1; 228/124.5

(58) Field of Classification Search
USPC ............... 228/122.1, 123.1, 124.1, 124.5
See application file for complete search history.

(56) References Cited

U.S. PATENT DOCUMENTS

| | | | | |
|---|---|---|---|---|
| 4,876,177 A | * | 10/1989 | Akahoshi et al. | 430/313 |
| 5,213,451 A | * | 5/1993 | Frank et al. | 406/72 |
| 5,244,143 A | * | 9/1993 | Ference et al. | 228/180.21 |
| 5,411,703 A | * | 5/1995 | Gonya et al. | 420/561 |
| 6,020,261 A | * | 2/2000 | Weisman | 438/669 |
| 6,076,723 A | * | 6/2000 | I-Tsung Pan | 228/33 |
| 6,213,886 B1 | | 4/2001 | Johnston | |
| 6,638,847 B1 | | 10/2003 | Cheung | |
| 6,681,982 B2 | | 1/2004 | Tung | |
| 7,784,673 B2 | | 8/2010 | Cordes et al. | |

(Continued)

OTHER PUBLICATIONS

P.A Gruber, et al."Low-cost wafer bumping". IBM J. Res. & Dev. vol. 49 No. 4/5 Jul./Sep. 2005.

(Continued)

*Primary Examiner* — Erin Saad
(74) *Attorney, Agent, or Firm* — Louis J. Percello; Otterstedt, Ellenbogen & Kammer, LLP (57) ABSTRACT

Solder bumps of uniform height are provided on a substrate through the use of injection molded solder. Copper pillars or ball limiting metallurgy are formed over I/O pads within the channels of a patterned layer of photoresist. Solder is injected over the pillars or BLM, filling the channels. The solder, which does not contain flux, is allowed to solidify. It forms a plurality of solder structures (bumps) of equal heights. Solder injection and solidification are preferably carried out in a nitrogen environment or a forming gas environment. Molten solder can be injected in channels formed in round wafers without spillage using a carrier assembly that accommodates such wafers and a fill head.

9 Claims, 5 Drawing Sheets

(56) References Cited

U.S. PATENT DOCUMENTS

| | | |
|---|---|---|
| 2003/0013291 A1* | 1/2003 | Chen et al. .................... 438/613 |
| 2003/0073036 A1* | 4/2003 | Peng et al. .................... 430/311 |
| 2003/0133762 A1* | 7/2003 | Yamamoto et al. ........... 406/198 |
| 2004/0180473 A1* | 9/2004 | Kawai ............................ 438/114 |
| 2004/0211675 A1* | 10/2004 | Dong et al. ................... 205/640 |
| 2008/0029686 A1 | 2/2008 | Gruber et al. |
| 2009/0029686 A1 | 1/2009 | Miller |
| 2009/0181223 A1 | 7/2009 | Buchwalter |
| 2009/0283575 A1 | 11/2009 | Budd |
| 2009/0302096 A1 | 12/2009 | Budd |
| 2010/0116871 A1 | 5/2010 | Gruber |

OTHER PUBLICATIONS

T. Fritzsch, et al. "Cost effectiveflipchipassemblyandinterconnectiontechnologiesforlarge area pixelsensorapplications". 2010 Elsevier B.V.

Jae-Woong Nah, et al. "A Study on Coining Processes of Solder Bumps on Organic Substrates". IEEE Transactions on Electronics Packaging Manufacturing, vol. 26, No. 2, Apr. 2003.

DuPont™ WBR 2000 Series (2008).

P.A Gruber, et al. "Direct IMS (Injection Molded Solder) Without a Mask for Forming Solder Bumps on Substrates" US #. U.S. Appl. No. 12/706,212, filed Feb. 16, 2010.

* cited by examiner

INJECTION MOLDED SOLDER PROCESS FOR FORMING SOLDER BUMPS ON SUBSTRATES

CROSS-REFERENCE TO RELATED APPLICATION

This application is a continuation of U.S. patent application Ser. No. 13/154,412 filed 6 Jun. 2011, the complete disclosure of which is expressly incorporated herein by reference in its entirety for all purposes.

FIELD OF THE INVENTION

The present invention generally relates to the electrical and electronic arts and, more particularly, to injection molded solder techniques, and solder deposition on substrates.

BACKGROUND OF THE INVENTION

Flip chip technology has been widely used as it allows a high I/O count, high density interconnection scheme with proven performance and reliability. Solder bumps are deposited on contact pads on chip surfaces and the chips are then flipped and positioned such that the solder bumps are aligned with matching pads of an external circuit. Solder reflow completes the interconnection process, after which underfill material is introduced to fill the spaces about the interconnections.

Flip chip interconnection assemblies have included copper pillars having solder caps. The copper pillars and solder caps may each be formed by electroplating, which process can lead to non-uniformity in the heights of the pillars and caps. There may accordingly be more or less solder in the pillar-cap assemblies, compromising the ability to ensure reliable interconnections following reflow.

U.S. Pat. No. 6,213,386 of Inoue et al., entitled 'Method of forming bumps,' discloses wherein preformed solder balls and a tool having a large number of through-holes are used, and under the condition that the through-holes of the tool are aligned with the pads of the semiconductor device, the solder balls are charged into the through-holes, pressed to be fixed on the pads, and then reflowed to form bumps. This method also does not disclose forming bumps of uniform height on non-uniform copper pillars.

SUMMARY OF THE INVENTION

Principles of the present invention provide techniques for direct IMS (injection molded solder) for forming solder bumps on substrates. In one aspect, an exemplary method includes providing a substrate having a plurality of contact pads, providing a layer of photoresist, which may be a dry film, on the substrate, patterning the layer of photoresist such that a plurality of channels are formed over the contact pads, each of the channels having substantially the same height, depositing metal over the contact pads, passing a fill head containing molten solder over the channels while the substrate is in a low oxygen environment, injecting molten solder containing no flux into the channels from the fill head, and allowing the solder to solidify, whereby said solder adheres to the metal and forms bumps of substantially the same height in the channels, and removing the layer of photoresist.

In accordance with a further aspect of the invention, a method is provided that includes positioning a round wafer on a carrier such that a top surface of the wafer is coplanar with a top surface of the carrier, applying a dry film of photoresist to the top surface of the wafer and the top surface of the carrier, patterning the photoresist, thereby creating channels in the photoresist, depositing metal on the top surface of the wafer, and passing a fill head containing molten, flux-free solder over the wafer and carrier while the fill head injects the molten, flux-free solder into the channels such that the solder contacts the metal and fills the channels. Optionally, if required, a dry film of photoresist may be cured by heat treatment in an oven before molten solder injection and after depositing metal. The method further includes solidifying the solder in the channels, forming solder bumps of uniform height whether the copper pillars are of uniform or non-uniform height. The dry film of photoresist is removed and the wafer is detached from the carrier.

A further aspect of the invention provides a method that includes providing a substrate having a plurality of electrically conductive contact pads. A layer of photoresist is provided on the substrate. The photoresist layer is patterned such that a plurality of channels are formed over the contact pads, each of the channels having substantially the same height. The method further includes electroplating copper over the contact pads, forming a plurality of copper pillars in the channels, each of the copper pillars having a height less than the height of the channels. Molten solder is injected into the channels over the copper pillars such that the copper pillars and molten solder completely fill the channels. This step is followed by solidifying the solder and removing the layer of photoresist.

An assembly is provided in accordance with a further aspect of the invention for injecting solder on round wafers evenly and while minimizing or eliminating spillage of solder. Such an assembly comprises a carrier including a circular recess and a planar surface surrounding the circular recess, the diameter of the recess being smaller than the length and width of the carrier. A fill head is provided for depositing molten solder positioned over the carrier and engaging the planar surface of the carrier, the fill head including a slot for dispensing solder, the length of the slot being substantially the same as the diameter of the circular recess.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules

DETAILED DESCRIPTION OF PREFERRED EMBODIMENTS

Initially, the complete disclosure of commonly assigned U.S. patent application Ser. No. 12/706,212 filed Feb. 16, 2010, entitled "Direct IMS (Injection Molded Solder) Without a Mask for Forming Solder Bumps on Substrates" and U.S. Pub. No. 2010/0116871 entitled "Injection Molded Solder Method for Forming Solder Bumps on Substrates" are expressly incorporated herein by reference in their entireties for all purposes.

Figure 1:
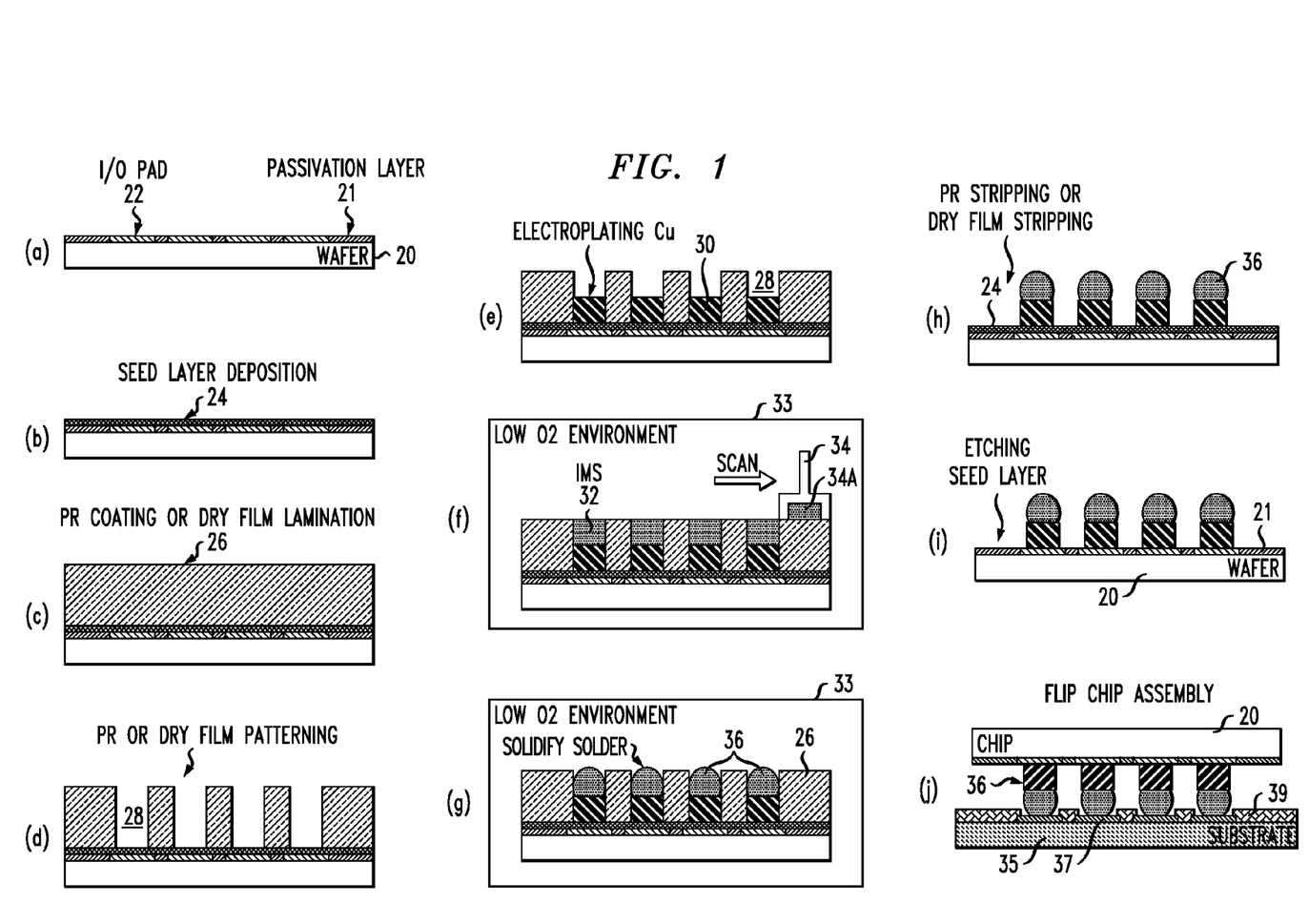
FIGS. 1(a)-(j) schematically illustrate an IMS procedure for wafer bumping including electroplating of Cu pillars which have ideal uniform height.

Referring to FIGS. 1(a)-1(j), steps in performing a method in accordance with one aspect of the invention are shown. A wafer 20 including a passivation layer 21 and rows of I/O pads 22 is shown in FIG. 1(a). The wafer may be comprised of silicon or other suitable composition. The pads 22 are made from a conductive material such as copper or aluminum. A thin, conductive seed layer 24 is deposited on the wafer as shown in FIG. 1(b). The seed layer is comprised of a suitable metal(s) such as TiCu. A photoresist layer 26 is applied to the seed layer as shown in FIG. 1(c). The layer 26 may be applied as a coating or by laminating a dry film using heat and pressure. Photoresist (PR) deposition and dry film lamination techniques known in the art for providing such a layer. The layer 26 preferably has a thickness between 10-200 μm, and more preferably between 25-100 μm. The layer is patterned in the step shown in FIG. 1(d) by subjecting the photoresist layer to light through a mask (not shown) and removing developed or undeveloped photoresist, depending on the type of photoresist employed. If a laminated film is employed, the protective layer (not shown) above the photoresist is removed shortly before photoresist development. As shown in the figure, the photoresist above the pads 22, following etching and washing, is removed. A plurality of vertical channels 28 are accordingly formed over the pads, each having a height equal to the thickness of the PR layer 26. Because the photoresist layer has a substantially uniform thickness over the entire wafer, the channels 28 have a substantially uniform height. As shown in FIG. 1(e), metal, preferably copper is deposited over each pad 22 by electroplating, forming copper pillars 30. Electroplating is the preferred form of copper deposition for forming pillars of sufficient height, particularly for fine pitch applications. The pillars are ideally substantially uniform in height, for example between about 5-60 μm. In practice, however, the heights of the pillars may not be uniform. A twenty percent variation of pillar height in a chip is possible.

As the height of the copper pillars increases and the pitch among them decreases, the height variation accordingly also increases. In some applications, the heights of the copper pillars may exceed half the heights of the channels. In addition to the differences in heights of the copper pillars from channel to channel, one side of a pillar in a particular channel can be higher than another side by several microns. As discussed below, the techniques employed in accordance with the invention accommodate possible non-uniformity in the heights of the pillars 30.

Referring to FIG. 1(f), each channel 28 is injected with molten solder 32 by a fill head 34 that traverses the wafer. The channels are filled completely to the tops, thereby ensuring uniformity of height of the resulting copper/solder bumps. No solder flux is required nor is any employed in the preferred embodiment of the invention. The absence of flux prevents volume shrinkage. The molten solder is directly injected into the channels in a low oxygen environment 33, preferably less than 10,000 ppm in a nitrogen environment. Alternatively, a forming gas environment including nitrogen and hydrogen may be employed (e.g. 90% $N_2$, 10% $H_2$). The solder solidifies as shown in FIG. 1(g), also in a low oxygen environment, forming the bumps 36 as shown due to solder surface tension. The bumps preferably extend over the tops of the channels as shown. Following solidification of the solder, the photoresist layer 26 is stripped (etched) away, followed by etching of the seed layer as shown in FIGS. 1(h) and 1(i), respectively. The resulting assembly is flipped over so that its pads are aligned with matching pads on a circuit board or another chip or wafer such as the pads 37 on the substrate 35 as shown in FIG. 1(j). Electrical connection of the two assemblies is facilitated by solder reflow (not shown). The above-described process does not require use of a mask, does not limit bump pitch, allows the use of a variety of solder materials, including binary, ternary and quaternary compositions, and avoids waste of materials. It also compensates for non-uniformity in pillar height as IMS fills the channels of the photoresist. As uniform thickness of the photoresist, whether deposited or applied using a dry film, is easily achieved, the resulting bumps will be substantially uniform in height regardless of variations in height of the copper pillar portions of the bumps. Flip chip assembly yield is accordingly improved over methods such as electroplating. Optionally, if required, a dry film of photoresist may be cured by heat treatment in an oven before molten solder injection and after depositing metal.

The above-referenced method is not limited to providing solder bumps of one size or composition throughout the wafer. By varying channel diameters, a variety of sizes of solder bumps 36 may be provided. Different solder compositions can be provided by, for example, using IMS of one solder type, e.g. SnCu, in one portion of a wafer and filling the channels of another portion with, for example, molten SnAg solder.

Figure 2:
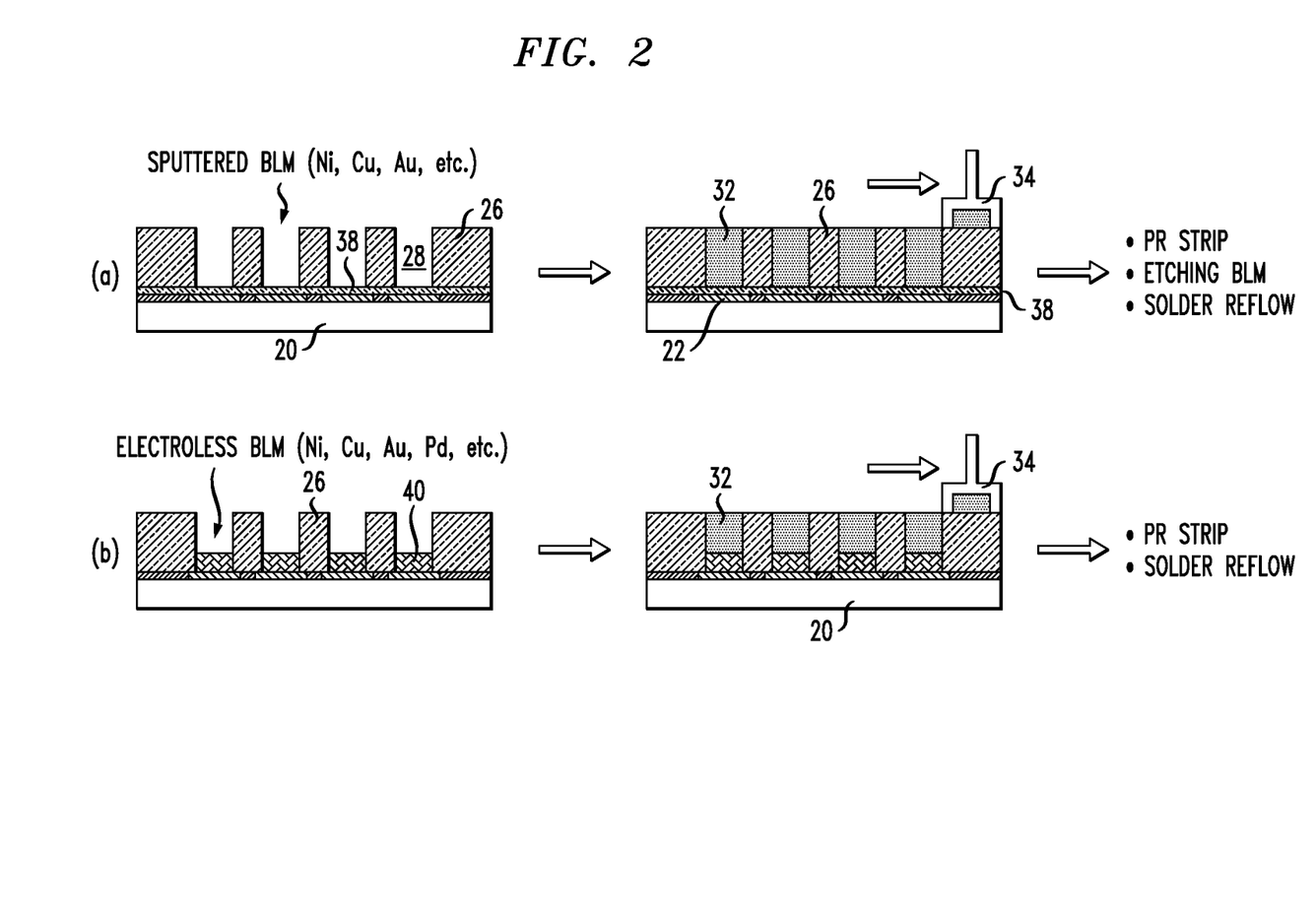
FIG. 2(a) schematically illustrates a step of a procedure for wafer bumping including sputtering BLM.
FIG. 2(b) schematically illustrates a step of a procedure for wafer bumping including electroless deposition of BLM.

FIGS. 2(a) and 2(b) illustrate two alternative steps that replace the electroplating step as shown in FIG. 1(e). All other steps illustrated described with respect to FIGS. 1(a)-1(j) in forming a bump would be performed in conjunction with such alternative steps. Referring first to FIG. 2(a), ball limiting metallurgy (BLM) 38 is provided in the channels 28 by sputtering. This step is followed by IMS. The thickness of the BLM is less than five microns in this illustrative example. In FIG. 2(b), electroless deposition of BLM (e.g. Ni, Cu, Au, Pd) provides a solder-wettable structure 40 that will underlie the solder 32 injected in the following step. No seed layer is required for electroless deposition on the silicon or glass wafer. The thickness of the solder-wettable structure is between 2-10 μm in this illustrative example. The above techniques advantageously provide simple molten solder injection for forming high volume solder bumps on very fine pitch, for example less than an 80 micron pitch.

In some instances, a nitrogen environment during the IMS process serves to make the solder "ball-up" during the solidification of the injected molten solder, causing the top portion of the bump to become generally spherical as shown in FIG. 1(g). Thus, the presence of a nitrogen environment has the potential to eliminate the subsequent reflow process typically used in other cases. This reduces the number of process steps and thus cost. Instead of nitrogen a forming gas environment can be used. The forming gas is a mixture of Nitrogen ($N_2$) and Hydrogen ($H_2$); generally, 90% $N_2$ and 10% $H_2$.

Figure 3:
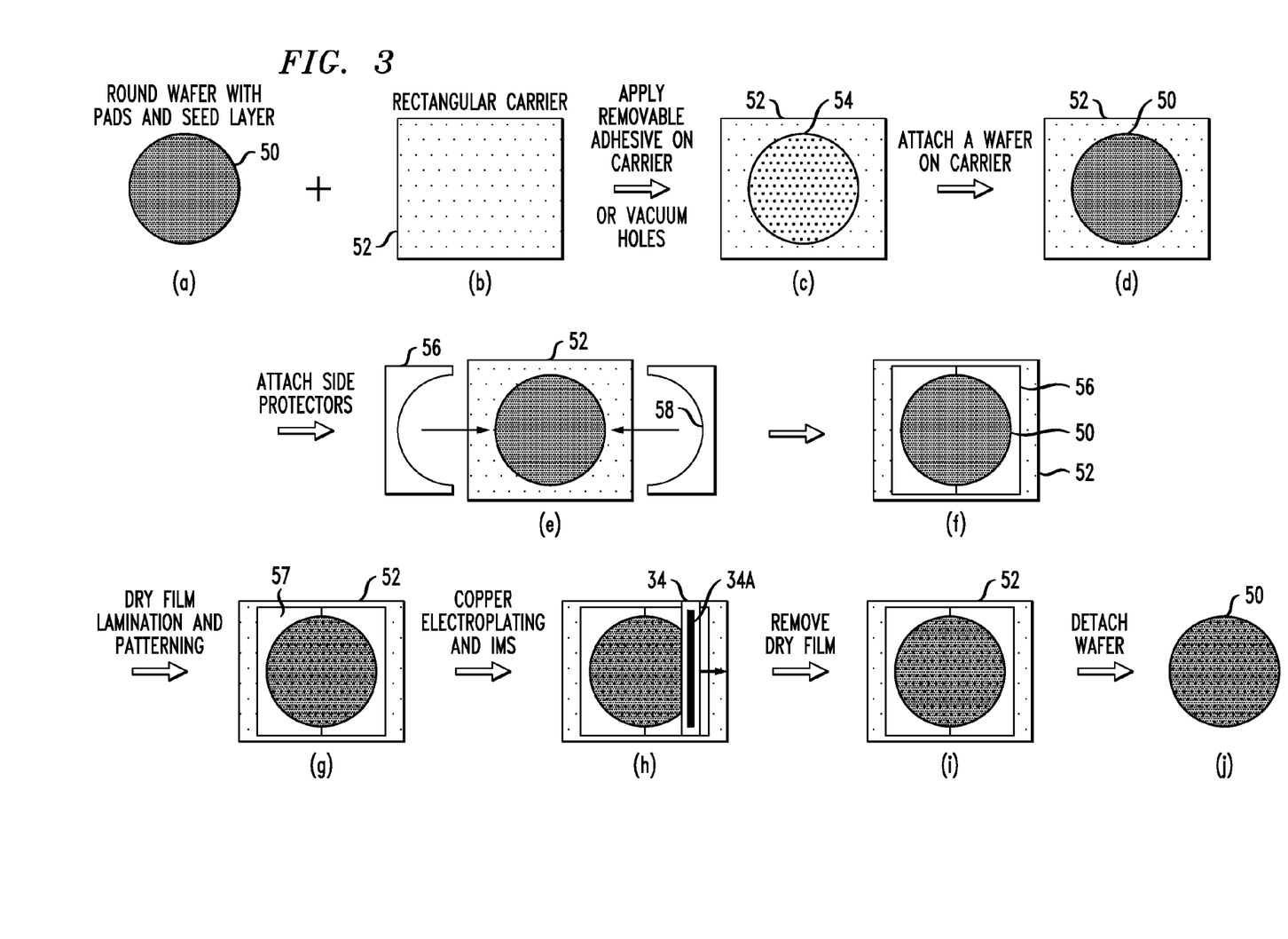
FIGS. 3(a)-3(j) schematically illustrate a procedure for wafer bumping of round wafers.

Solder bumps such as bumps 36 described above may be formed on wafers having rectangular or circular configurations. FIGS. 3(a)-(j) and 4(a)-(g) illustrate techniques for providing solder to round wafers 50. A rectangular carrier includes a base 52 having dimensions larger than the diameter of the wafer is provided for receiving the wafer 50 for further processing. The carrier may include a plurality of openings through which vacuum pressure may be applied. Alternatively, an adhesive may be applied to the carrier in a pattern corresponding to the shape of the wafer. Each approach provides a wafer retention area 54 shown in FIG. 3(c) to which the wafer is mounted as shown in FIG. 3(d). Wafer protectors 56 are positioned in adjoining relation to the wafer as shown in FIGS. 3(e) and 3(f). Each wafer protector includes a semicircular wall 58 that has the same diameter as that of the wafer. The wafer thickness is also equal to the thickness of the protectors in this illustrative embodiment. The top surfaces of the wafer and protectors are accordingly coplanar. The wafer is accordingly bounded by the semicircular walls 58 of the protectors 56, which adjoin or contact the outer surface of the wafer. The protectors 56 are preferably adhered to the carrier base by an adhesive or a vacuum and can be considered part of the carrier. Dry film lamination and patterning procedures as described above are then performed, as schematically shown in FIG. 3(g). Dry films 57 that exhibit heat resistance exceeding 300° C. reflow temperatures are commercially available and are applied using a pressurized hot roll. Dry photoresist, which provides uniform photoresist thickness on a wafer may be employed in conjunction with one or more embodiments of the invention. As shown in FIG. 3(g), the dry film is positioned over the wafer 50 as well as the adjoining surfaces of the protectors 56. Following lamination, the dry film layer is patterned in the area of the wafer with lithography. A plurality of vertical channels are accordingly formed over the electrically conductive pads on the wafer similar to the channels 28 discussed above. After electroplating to form copper pillars within the channels, IMS application follows as described above and illustrated in FIG. 3(h). Optionally, if required, the dry film of photoresist may be cured by heat treatment in an oven before molten solder injection and after electroplating copper pillars. The fill head 34, which is positioned over the carrier, moves translationally at a constant speed with respect to the carrier and wafer, filling the channels in the dry film. There is substantially no spillage due to the coplanar surfaces of the wafer and protectors 56 as well as the engagement of the fill head with the dry film 57 on the coplanar surfaces, forming an effective seal. The fill head 34 may include a slot 34A for depositing solder that is substantially the same as the wafer diameter, allowing all channels in the resist to be filled in one scan. The translational movement of the fill head facilitates uniform filling of the channels with solder as the slot 34A remains over each channel for the same amount of time. The dry film is removed and the wafer detached from the carrier as shown in FIGS. 3(i) and 3(j). The seed layer is removed by etching either following detachment of the wafer from the carrier or when the wafer is still on the carrier.

Figure 4:
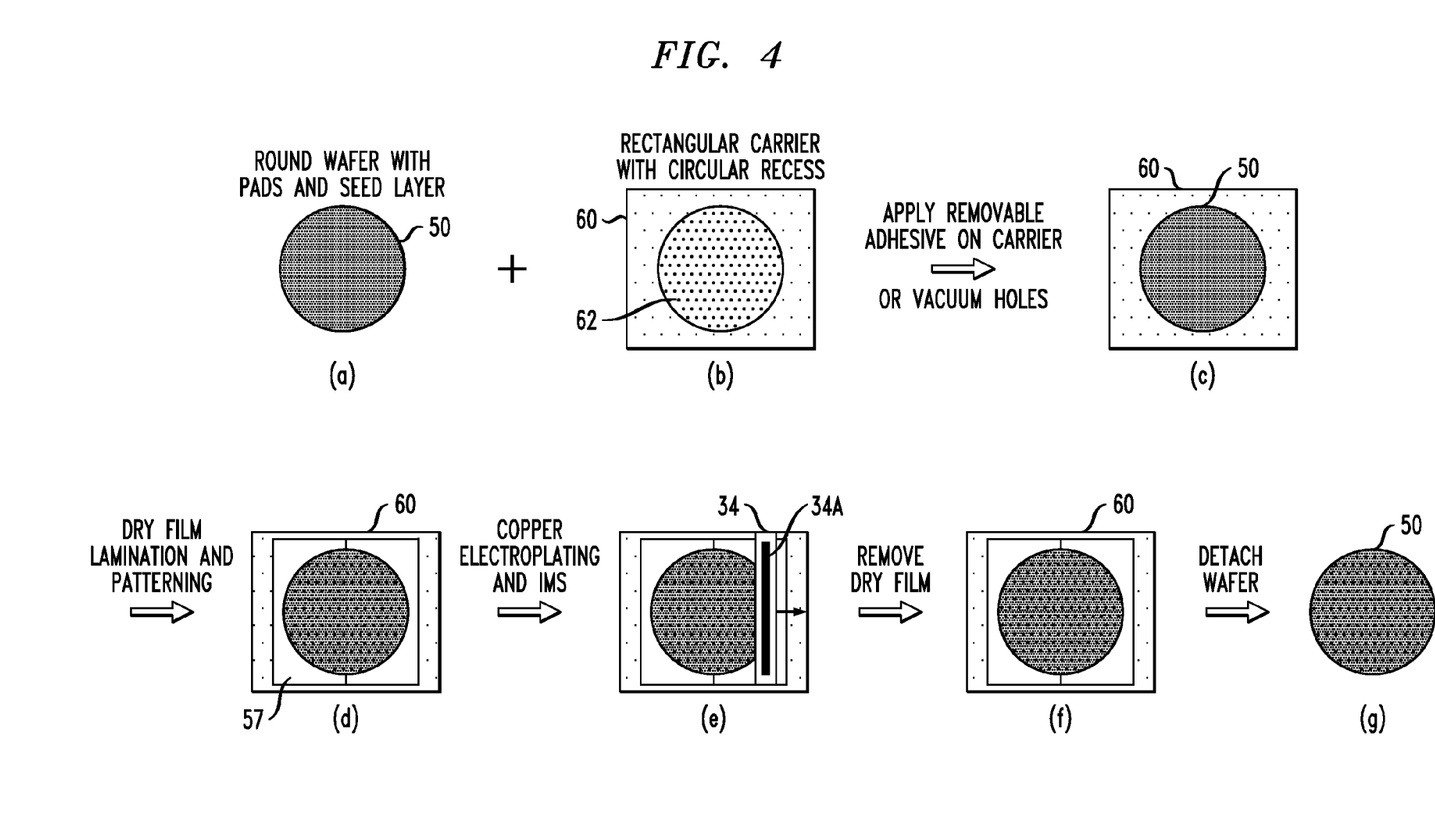
FIGS. 4(a)-4(g) schematically illustrate alternative steps for wafer bumping round wafers.
Figure 5:
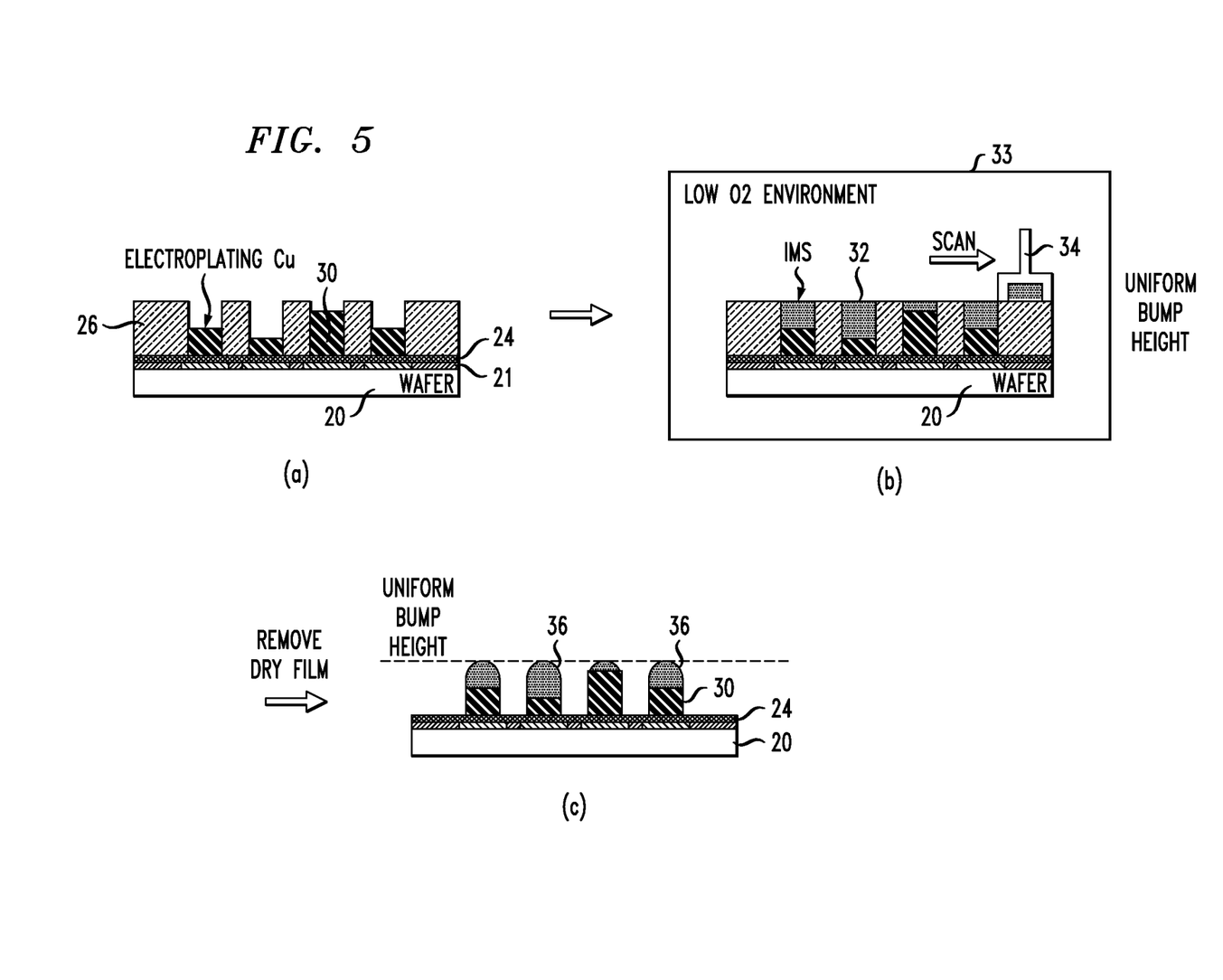
FIGS. 5(a)-5(c) illustrate the steps of electroplating, solder injection, and removal of dry film to produce bumps of equal height when electroplated Cu pillars have non-uniform height.

FIGS. 4(a)-(g) show an alternative embodiment for facilitating the production of solder bumps wherein the top surfaces of the wafer and rectangular carrier 60 are maintained in a coplanar relationship during the IMS process. The carrier, which may comprise glass, poly-Si, or other suitable material, includes a circular recess 62 as shown in FIG. 4(b). The depth of the recess is substantially the same as the thickness of the wafer 50 to be processed so that the top surfaces of the carrier and wafer are as coplanar as possible. Its diameter is substantially the same as that of the wafer while providing minimum clearance for allowing the wafer to be inserted therein. Any such clearance should not allow the admission of photoresist or molten solder when the fill head traverses the carrier and wafer. The recess 62 can be formed integrally with the carrier or by a separate element (not shown) similar to the protectors 56 described above that defines an opening for receiving the wafer. Such a separate element may comprise one or more pieces. As in the previous example, a removable adhesive and/or a plurality of vacuum holes may be provided in the carrier for maintaining the wafer in place. Upon mounting the wafer in the recess, dry film lamination followed by patterning, IMS, etc. as shown in FIGS. 4(d)-(g) is performed. The dry film 57 is applied to the wafer and adjoining surface of the carrier 60, forming a planar surface that is engaged by the fill head 34 after patterning. The width of the dry film exceeds the length of the slot 34A of the fill head as shown in FIG. 4(e). Solder injection is preferably discontinued when the slot 34A is fully past the wafer but not beyond the dry film layer.

Advantages of IMS for wafer bumping as described herein include the absence of requirements for a mask, no limitation with respect to bump pitch, the ability to use binary, ternary or quaternary solder compositions, little or no waste of materials, and uniform bump heights. As discussed above, the preferred method of forming copper pillars through electroplating copper above the contact pads in the channels often and probably usually results in non-uniformity of pillar height. FIGS. 5(a)-(d) illustrate the steps of electroplating to provide copper pillars 30 on the seed layer 24 above the I/O pads, solder injection in a low oxygen environment 33, and the removal of dry film 70 to provide bumps 36 of equal height. Despite the differences in the heights of the pillars 30, uniform solder bump height is obtained as the thickness of the dry film is uniform, the channels 28 are completely filled by a combination of the copper and solder, and there is no shrinkage upon solidification or reflow of the solder. Chip assembly yield can accordingly be improved.

One or more embodiments of the invention may employ almost any kind of solder. Eutectic SnPb and Pb-free solder (pure Sn, SnAgCu, SnAg, SnCu, SnBi, SnIn, SnAu, etc.) are non-limiting examples of suitable solders. In contrast, it is difficult to plate ternary or quaternary solder compositions using electroplating methods and difficult to control the volume of electroplated solder. When the solder is injected into the channels 28, the temperature of solder is above its melting temperature but below the melting temperature of the photoresist. The oxygen concentration in the nitrogen environment is preferably less than 10,000 ppm. The nitrogen does not have to be perfectly pure and the forming gas does not have to have the exact composition as described elsewhere. The environment in which IMS and solder solidification occurs should preferably, however, allow formation of structures such as shown in FIGS. 1(f) and 1(g), respectively.

The absence of flux using IMS as discussed above is preferred as there is no material volume shrinkage. Stencil printing using dry film and solder paste requires cleaning of flux residue, possible reaction between flux and dry film that could make a residue that is difficult to clean, and non-uniform bump heights after reflow. Using stencil printing with solder paste, it is very difficult to form uniform bump height when copper pillars have non-uniform height because the ratio of solder powders/flux are different from channel to channel In one or more embodiments, the step of directly injecting the molten solder is carried out with an injection molded solder fill head, and an additional step includes causing relative motion, preferably translational motion, between (i) the head and (ii) the substrate, during the injecting.

The methods described above can be used in the fabrication and packaging of integrated circuit chips, particularly flip chips; in particular, techniques set forth herein can be used to make arrays of solder bumps for attachment to an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

Aspects of the present invention are described herein with reference to flowchart illustrations of methods and apparatus (systems) according to embodiments of the invention. It will be understood that each block of the flowchart illustrations, and combinations of blocks in the flowchart illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It should be noted that any of the methods described herein can include an additional step of providing a system comprising distinct software modules embodied on a computer readable storage medium; the modules can include, for example, an initialization module, a module to cycle through test points and parameters, an output module to generate an output file, a post-processing module to reduce the data and search for anomalies, and the like. The method steps, such as those described with respect to FIGS. 1(a)-(j), can then be carried out using the distinct software modules and/or sub-modules of the system, as described above, executing on one or more hardware processors. Further, a computer program product can include a computer-readable storage medium with code adapted to be implemented to carry out one or more method steps described herein, including the provision of the system with the distinct software modules.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
    positioning a round wafer on a carrier such that a top surface of the wafer is coplanar with a top surface of the carrier;
    positioning wafer protectors in adjoining relation to the wafer, the wafer protectors comprising the top surface of the carrier, the wafer protectors further comprising a pair of protective elements, each protective element having a semicircular opening defined by semicircular walls, wherein the step of positioning the wafer protectors includes positioning the protective elements such that the semicircular walls adjoin the wafer and form a circular opening having a diameter matching the diameter of the wafer;
    applying a dry film of photoresist to the top surface of the wafer and an adjoining top surface of the carrier;

patterning the photoresist, thereby creating channels in the photoresist;

forming metal pillars on the top surface of the wafer;

passing a fill head containing molten, flux-free solder over the wafer and carrier while injecting the molten, flux-free solder into the channels such that the solder contacts the metal pillars and completely fills the channels;

solidifying the solder in the channels, forming solder bumps of uniform height;

removing the dry film of photoresist, and detaching the wafer from the carrier.

2. The method of claim 1, wherein the carrier is rectangular and has a length and width exceeding the diameter of the wafer.

3. The method of claim 1, further including the step of affixing the wafer to the carrier.

4. The method of claim 3, wherein the step of affixing the wafer to the carrier includes applying an adhesive to the carrier.

5. The method of claim 3, wherein the carrier includes a plurality of holes and the step of affixing the wafer to the carrier includes applying a vacuum through the plurality of holes in the carrier.

6. The method of claim 1, wherein the step of passing the fill head over the wafer and carrier includes moving the fill head translationally with respect to the wafer and carrier.

7. The method of claim 1, further including the step of curing the layer of photoresist by heat treatment prior to injecting molten, flux-free solder into the channels.

8. The method of claim 1, wherein the wafer includes a plurality of electrically conductive pads, the molten, flux-free solder is a tin-based solder, and further wherein the step of depositing forming metal pillars includes electroplating copper over the contact pads to form copper pillars within the channels.

9. The method of claim 8, further including depositing a conductive seed layer on the wafer prior to applying the dry film.

\* \* \* \* \*